United States Patent
Jia et al.

(10) Patent No.: US 9,791,752 B2
(45) Date of Patent: Oct. 17, 2017

(54) PERIPHERAL WIRING STRUCTURE OF DISPLAY SUBSTRATE, DISPLAY SUBSTRATE DISPLAY PANELAND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Weihua Jia, Beijing (CN); Peng Jiang, Beijing (CN); Haipeng Yang, Beijing (CN); Jaik-Wang Kim, Beijing (CN); Yong-Jun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/129,867

(22) PCT Filed: Jun. 8, 2015

(86) PCT No.: PCT/CN2015/081004
§ 371 (c)(1),
(2) Date: Sep. 28, 2016

(87) PCT Pub. No.: WO2016/095456
PCT Pub. Date: Jun. 23, 2016

(65) Prior Publication Data
US 2017/0176789 A1 Jun. 22, 2017

(30) Foreign Application Priority Data
Dec. 16, 2014 (CN) .................... 2014 2 0799716 U

(51) Int. Cl.
*G02F 1/1345* (2006.01)
*G09G 3/36* (2006.01)
*G02F 1/1333* (2006.01)

(52) U.S. Cl.
CPC .......... *G02F 1/1345* (2013.01); *G09G 3/3611* (2013.01); *G02F 2001/133388* (2013.01)

(58) Field of Classification Search
CPC ...... G02F 1/1345; G02F 2001/133388; G09G 3/3611; H01L 27/124; H01L 27/3276; H01L 27/3297; H01L 23/52
See application file for complete search history.

(56) References Cited

U.S. PATENT DOCUMENTS 6,204,557 B1 * 3/2001 Lien ...................... H01L 23/528
257/620
6,879,367 B2 4/2005 Ukita
(Continued)

FOREIGN PATENT DOCUMENTS

| CN | 1416001 A | 5/2003 |
| CN | 1595264 A | 3/2005 |

(Continued)

OTHER PUBLICATIONS

International Search Report and Written Opinion, including the English translation of Box No. V of the Written Opinion, for International Application No. PCT/CN2015/081004, dated Sep. 9, 2015, 7 pages.

*Primary Examiner* — Joseph L Williams
*Assistant Examiner* — Jose M Diaz
(74) *Attorney, Agent, or Firm* — Westman, Champlin & Koehler, P.A.

(57) ABSTRACT

An embodiment of the present disclosure relates to the field of display technology, especially to a peripheral wiring structure of a display substrate, and a display substrate. In each two adjacent wirings on a display substrate, a first peripheral wiring structure has a first bent part which includes a first inclined surface, a first top surface, a second inclined surface; and a second peripheral wiring structure has a second bent part which includes a third inclined
(Continued)

surface, a second top surface, a fourth inclined surface; a centerline of the second bent part is located between two adjacent first bent parts, and the third inclined surface of the second bent part is opposite to and parallel to the second inclined surface of one first bent part, and the distance between the third and second inclined surfaces is larger than that between the second and first top surfaces; the fourth inclined surface is opposite to and parallel to the first inclined surface of another first bent part, and the distance between the fourth and first inclined surfaces is larger than that between the second and first top surfaces. The distance between the adjacent peripheral wirings in the above-described display substrate may be smaller than the minimal distance of the Array process, which contributes to achieve a narrow border design of a display device.

8 Claims, 3 Drawing Sheets

(56) References Cited

U.S. PATENT DOCUMENTS

| | | | |
|---|---|---|---|
| 7,453,542 B2 | 11/2008 | Muramatsu et al. | |
| 7,714,815 B2 * | 5/2010 | Kim | G09G 3/3233 345/82 |
| 7,924,388 B2 | 4/2011 | Abe | |
| 8,300,200 B2 * | 10/2012 | Jheng | G02F 1/1345 349/149 |
| 8,467,027 B2 * | 6/2013 | Chang | G02F 1/1339 349/110 |
| 8,614,680 B2 * | 12/2013 | Lin | G06F 3/044 257/666 |
| 8,902,597 B2 | 12/2014 | Sato | |
| 2007/0080433 A1 * | 4/2007 | Lai | G02F 1/1345 257/666 |
| 2007/0195254 A1 * | 8/2007 | Lee | G02F 1/1345 349/149 |
| 2009/0184946 A1 * | 7/2009 | Ahn | G02F 1/133512 345/206 |
| 2010/0237892 A1 | 9/2010 | Ueno | |
| 2014/0232954 A1 | 8/2014 | Suzuki | |

FOREIGN PATENT DOCUMENTS

| | | |
|---|---|---|
| CN | 101183200 A | 5/2008 |
| CN | 102486906 A | 6/2012 |
| CN | 103996385 A | 8/2014 |
| JP | 2002287662 A * | 10/2002 |

* cited by examiner

PERIPHERAL WIRING STRUCTURE OF DISPLAY SUBSTRATE, DISPLAY SUBSTRATE DISPLAY PANEL AND DISPLAY DEVICE

CROSS-REFERENCE TO RELATED APPLICATION

This application is a 371 National Stage application of PCT/CN2015/081004, filed 8 Jun. 2015, which published as WO 2016/095456 A1 on 23 Jun. 2016, which claims priority to Chinese Patent Application No. 201420799716.8 filed on Dec. 16, 2014 in the State Intellectual Property Office of China, the whole disclosure of which is incorporated herein by reference.

TECHNICAL FIELD

The embodiments of the present disclosure relate to the field of display technology, especially to a peripheral wiring structure of a display substrate, a display substrate, and a display panel.

BACKGROUND

In the prior art, serpentine wirings are commonly used in the peripheral wirings of the display substrate, such that the peripheral wirings in a non-display region of the display panel meet electrical requirements such as equal resistance, as shown in FIG. 1.

In the peripheral wirings of the display substrate illustrated in FIG. 1, a peripheral wiring 01 is adjacent to a peripheral wiring 02, and the peripheral wiring 01 is provided with a plurality of second openings 012 opening towards the peripheral wiring 02 and a plurality of first openings 011 opening in a direction opposite to the peripheral wiring 02, such that the peripheral wiring 01 forms a serpentine shape. The peripheral wiring 02 is provided with a plurality of first openings 021 opening towards the peripheral wiring 01 and a plurality of second openings 022 opening in a direction opposite to the peripheral wiring 01, such that the peripheral wiring 02 forms a serpentine shape. As shown in FIG. 1, each bent part of the peripheral wirings 01 and 02 has a right angle design and the distance between the peripheral wirings 01 and 02 is a, as shown in FIG. 1. The minimum distance between the peripheral wirings formed in an Array process must be within a range of the minimum process accuracy allowed by the Array process. As process accuracy is limited in the prior art, distance a between the peripheral wirings 01 and 02 cannot be too small due to the limitation of the Array process accuracy, resulting in that the whole width of the peripheral wiring is relative large, and it is adverse to a narrow border design of a display device.

SUMMARY

Accordingly, the present disclosure provides a peripheral wiring structure of a display substrate, a display substrate, and a display panel. The peripheral wiring structure provided on the display substrate contributes to achieve a narrow border design of a display device.

To achieve the above object, the present disclosure provides the following technical solutions:

A peripheral wiring structure of a display substrate, comprises a plurality of peripheral wirings formed on the substrate, every peripheral wiring having a first opening part and a second opening part which are arranged alternatively such that the peripheral wiring has a shape of serpentine;

wherein in every two adjacent wirings, a first opening part of a first peripheral wiring opens to a second peripheral wiring, the first opening part of the first peripheral wiring is in one-to-one correspondence with the first opening part of the second peripheral wiring, and centerlines of every pair of the first opening parts corresponding to each other are coincident;

the second opening part of a second peripheral wiring opens to the first peripheral wiring, the second opening part of the second peripheral wiring is in one-to-one correspondence with the second opening part of the first peripheral wiring, and centerlines of every pair of the second opening parts corresponding to each other are coincident;

and wherein in every two adjacent wirings, in a first peripheral wiring, a first bent part bulged toward the second peripheral wiring is formed between every two adjacent first opening parts, the first bent part having a first inclined surface connected to a lateral surface of one first opening part, a first top surface connected to the first inclined surface, a second inclined surface connected to the first top surface and a lateral surface of another first opening part, wherein the first top surface is perpendicular to the arrangement direction of the plurality of peripheral wirings;

in a second peripheral wiring, a second bent part bulged toward the first peripheral wiring is formed between every two adjacent second opening parts, the second bent part having a third inclined surface connected to a lateral surface of one second opening part, a second top surface connected to the third inclined surface, a fourth inclined surface connected to the second top surface and a lateral surface of another second opening part, wherein the second top surface is perpendicular to the arrangement direction of the plurality of peripheral wirings;

in a direction perpendicular to the arrangement of the plurality of peripheral wirings, a centerline of each second bent part is located between two adjacent first bent parts, and the third inclined surface of the second bent part is opposite to and parallel to the second inclined surface of one first bent part, and the distance between the third and second inclined surfaces is larger than that between the second and first top surfaces; the fourth inclined surface of the second bent part is opposite to and parallel to the first inclined surface of another first bent part, and the distance between the fourth and first inclined surfaces is larger than that between the second and first top surfaces.

Optionally, each peripheral wiring has first opening parts and second opening parts which are arranged alternatively, and the opening direction of the first opening part is opposite to that of the second opening part, such that the peripheral wiring has a serpentine shape; and in each two adjacent wirings, the first opening part of the first peripheral wiring opens to the second peripheral wiring, the first opening part of the first peripheral wiring is in one-to-one correspondence with the first opening part of the second peripheral wiring, and centerlines of each pair of the first opening parts corresponding to each other are coincident; in the first peripheral wiring, a first bent part bulged toward the second peripheral wiring is formed between each two adjacent first opening parts, the first bent part having a first inclined surface connected to a lateral surface of one first opening part, a first top surface connected to the first inclined surface, and a second inclined surface connected to the first top surface and a lateral surface of another first opening part, wherein the first top surface is perpendicular to the arrangement direction of the plurality of peripheral wirings; the second opening part of the second peripheral wiring opens to the first peripheral wiring, the second opening part of the second peripheral wiring is in one-to-one correspondence with the second opening part of the first peripheral wiring, and centerlines of each pair of the second opening parts corresponding to each other are coincident; in the second peripheral wiring, a second bent part bulged toward the first peripheral wiring is formed between each two adjacent second opening parts, the second bent part having a third inclined surface connected to a lateral surface of one second opening part, a second top surface connected to the third inclined surface, and a fourth inclined surface connected to the second top surface and a lateral surface of another second opening part, wherein the second top surface is perpendicular to the arrangement direction of the plurality of peripheral wirings; the above structure is able to achieve that a centerline of each second bent part is located between two adjacent first bent parts, and the third inclined surface of the second bent part is opposite to and parallel to the second inclined surface of one first bent part, and the distance between the third and second inclined surfaces is larger than that between the second and first top surfaces; the fourth inclined surface of the second bent part is opposite to and parallel to the first inclined surface of another first bent part, and the distance between the fourth and first inclined surfaces is larger than that between the second and first top surfaces.

Accordingly, when preparing a peripheral wiring structure with an Array process, it is possible to form the distance between the third and the second inclined surfaces and the distance between the fourth and first inclined surfaces, and finally form the structure of above-mentioned peripheral wiring structure. As the distance between the first and second peripheral wirings are actually equal to the distance between the first and second top surfaces; Accordingly, in the formed peripheral wirings, the distance between the two adjacent peripheral wirings will not be limited by the Array process, and can be made to be very small, so that it can reduce the width of the whole peripheral wirings, achieving a narrow border design of a display device.

Optionally, in each first bent part, an angle formed by the first inclined surface and the first top surface is identical to that formed by the second inclined surface and the first top surface.

Optionally, the peripheral wiring structure according to claim 2, wherein the angle formed by the first inclined surface and the first top surface is 45° and the angle formed by the second inclined surface and the first top surface is 45°.

Optionally, the peripheral wiring structure according to claim 2, wherein the angle formed by the first inclined surface and the first top surface is 60° and the angle formed by the second inclined surface and the first top surface is 60°.

Optionally, in each peripheral wiring, and in each first opening part, a fifth inclined surface parallel to the third inclined surface is formed between a bottom surface and a lateral surface, and a sixth inclined surface parallel to the fourth inclined surface is formed between the bottom surface and another lateral surface.

Optionally, in each peripheral wiring, and in each second opening part, a seventh inclined surface parallel to the first inclined surface is formed between a bottom surface and a lateral surface, and a eighth inclined surface parallel to the second inclined surface is formed between the bottom surface and another lateral surface.

The present disclosure also provides a display substrate comprising a substrate and an above-mentioned peripheral wiring structure formed thereon.

The present disclosure also provides a display panel comprising the display substrate mentioned above.

The present disclosure also provides a display device comprising the display panel mentioned above.

The distance between the adjacent peripheral wirings in the display substrate provided by the present disclosure may be smaller than the minimal distance of the Array process, which contributes to achieve a narrow border design of a display device.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF PREFERRED EMBODIMENTS OF THE INVENTION

Exemplary embodiments of the present disclosure will be described hereinafter in detail with reference to the attached drawings. Many details are set forth in the following description to provide a thorough understanding of the embodiments of the present disclosure. The present disclosure may, however, be implemented without those details. In other circumstances, well-known structures and devices are illustrated so as to simplify the drawings.

Figure 1:
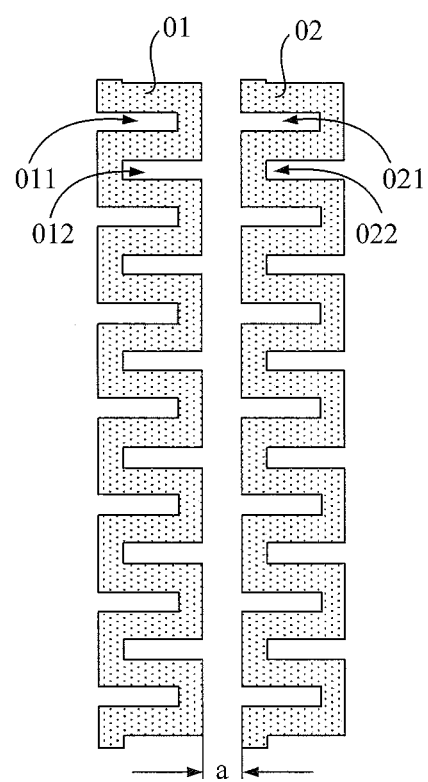
FIG. 1 is a schematic view of peripheral wirings of a display substrate in the prior art.
Figure 2:
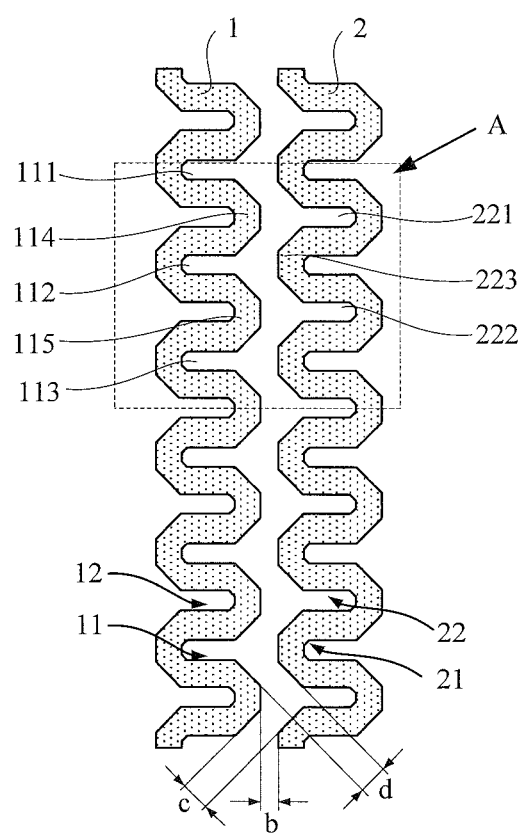
FIG. 2 is a schematic view of peripheral wirings of a display substrate according to an embodiment of the present disclosure.
Figure 3:
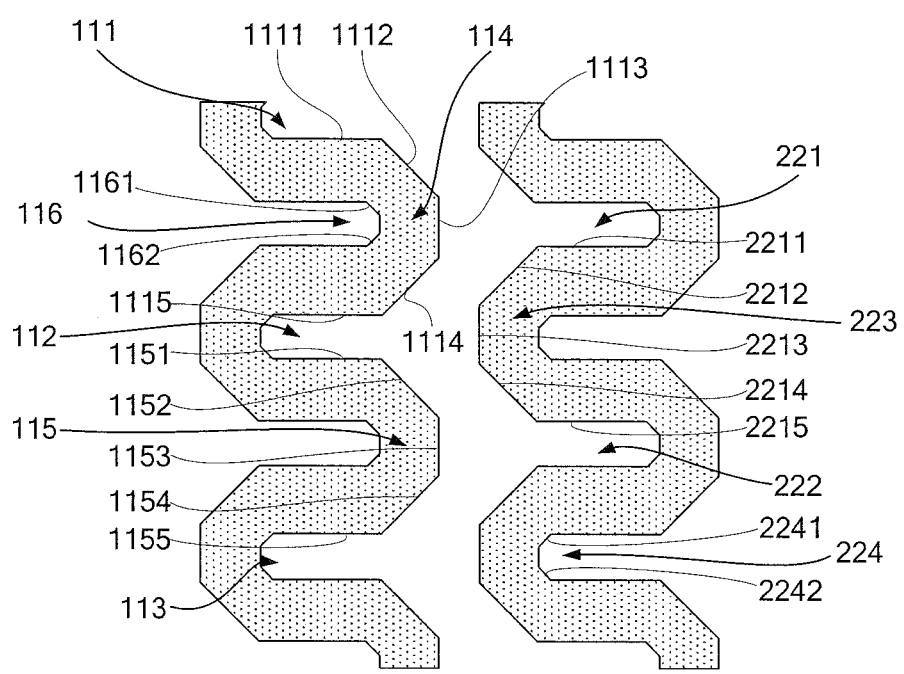
FIG. 3 is an enlarged schematic view of a dashed box part A in FIG. 2.

Please refer to FIGS. 2 and 3. As shown in FIG. 2, a display substrate provided in an embodiment of the present disclosure comprises a substrate and a plurality of peripheral wirings formed on the substrate. Each peripheral wiring has first opening parts and second opening parts which are arranged alternatively such that the peripheral wiring has a serpentine shape. Taking the first and second peripheral wirings 1, 2 shown in FIG. 2 as an example, the first peripheral wiring 1 has first opening parts 11 and second opening parts 12 which are arranged alternatively such that the first peripheral wiring 1 has a serpentine shape, and the second peripheral wiring 2 has first opening parts 21 and second opening parts 22 which are arranged alternatively such that the second peripheral wiring 2 has a serpentine shape. Further taking illustration of FIG. 2 as an example, in each two adjacent wirings:

The first opening part 11 of the first peripheral wiring 1 opens to the second peripheral wiring 2, the first opening part 11 of the first peripheral wiring 1 is in one-to-one correspondence with the first opening part 21 of the second peripheral wiring 2, and centerlines of each pair of the first opening parts 11, 21 corresponding to each other are coincident;

The second opening part 22 of the second peripheral wiring 2 opens to the first peripheral wiring 1, the second opening part 22 of the second peripheral wiring 2 is in one-to-one correspondence with the second opening part 12 of the first peripheral wiring 1, and centerlines of each pair of the second opening parts 12, 22 corresponding to each other are coincident;

In the first peripheral wiring 1, a first bent part bulged toward the second peripheral wiring 2 is formed between each two adjacent first opening parts 11, as shown in FIG. 2, a first bent part 114 between the first opening part 111 and the first opening part 112, a first bent part 115 between the first opening part 112 and the first opening part 113, wherein taking the first bent parts 114 and 115 as an example, as shown in FIG. 3, the first bent part 114 has a first inclined surface 1112 connected to a lateral surface 1111 of the first opening part 111, a first top surface 1113 connected to the first inclined surface 1112, and a second inclined surface 1114 connected to the first top surface 1113 and a lateral surface 1115 of the first opening part 112, wherein the first top surface 1113 is perpendicular to an arrangement direction of the plurality of peripheral wirings; the first bent part 115 has a first inclined surface 1152 connected to a lateral surface 1151 of the first opening part 112, a first top surface 1153 connected to the first inclined surface 1152, and a second inclined surface 1154 connected to the first top surface 1153 and a lateral surface 1155 of the first opening part 113, wherein the first top surface 1153 is perpendicular to the arrangement direction of the plurality of peripheral wirings.

In the second peripheral wiring 2, a second bent part bulged toward the first peripheral wiring 1 is formed between each two adjacent second opening parts 22, taking the second bent part 223 between the second opening part 221 and the second opening part 222 as an example, as shown in FIG. 3, the second bent part 223 has a third inclined surface 2212 connected to a lateral surface 2211 of the second opening part 221, a second top surface 2213 connected to the third inclined surface 2212, and a fourth inclined surface 2214 connected to the second top surface 2213 and a lateral surface 2215 of the second opening part 222, wherein the second top surface 2213 is perpendicular to the arrangement direction of the plurality of peripheral wirings;

Please refer to FIG. 3 in combination with FIG. 2, and take the structure shown in FIG. 3 as an example. In a direction perpendicular to the arrangement direction of the plurality of peripheral wirings, a centerline of the second bent part 223 is located between two adjacent first bent parts 114 and 115, and the third inclined surface 2212 of the second bent part 223 is opposite to and parallel to the second inclined surface 1114 of the first bent part 114, and the distance c between the third and second inclined surfaces 2212, 114 is larger than the distance b between the second and first top surfaces 2213, 1113; the fourth inclined surface 2214 of the second bent part 223 is opposite to and parallel to the first inclined surface 1152 of the first bent part 115, and the distance d between the fourth and first inclined surfaces 2214, 1152 is larger than the distance b between the second and first top surfaces 2213, 1153.

In the above-mentioned peripheral wiring structures, each peripheral wiring has first opening parts and second opening parts which are arranged alternatively, and the opening direction of the first opening part is opposite to that of the second opening part, such that the peripheral wiring has a serpentine shape. Further taking the structure illustrated in FIG. 3 as an example, when preparing the above-mentioned peripheral wiring structure with the Array process, it is possible to form the distance between the third inclined surface 2212 of the second bent part 223 of the second peripheral wiring 2 and the second inclined surface 1114 of the first bent part 114 of the first peripheral wiring 1 as well as the distance between the fourth inclined surface 2214 of the second bent part 223 and the first inclined surface 1152 of the first bent part 115, and finally form the structure of above-mentioned peripheral wiring structure. As the distance between the first and second peripheral wirings 1, 2 are actually equal to the distance between the first top surface 1113, 1153 and the second top surface 2213. Accordingly, in process of preparing the above-mentioned peripheral wiring structure, a horizontal distance b between two adjacent peripheral wirings is converted to the actual distance c between the inclined surfaces. The distance c is limited by the minimal value of the Array process. However, the horizontal distance b may be set very small, even less than or equal to c/2, which substantially reduces width of the whole peripheral wirings and achieves a narrow border design. The bent parts of the peripheral wirings form inclined planes, which can prevent point discharge phenomenon in comparison to the right angle bent part in the prior art. In this regard, such a situation is eliminated that the adjacent peripheral wirings in the peripheral wiring structure are burned due to point discharge phenomenon, which effectively improves product yield.

Further, in the above-mentioned peripheral wiring structure, the shape of each peripheral wiring also makes the bulged surfaces of the first bent part between each two first opening parts and the second bent part between each two second opening parts become smooth, which prevents point discharge phenomenon in the first and second bent parts.

In an alternative embodiment, in each first bent part provided in the first peripheral wiring, an angle formed by the first inclined surface and the first top surface is identical to that formed by the second inclined surface and the first top surface.

That is, in each first bent part, an angle formed by the plane of the first inclined surface and the plane of the first top surface is identical to that formed by the plane of the second inclined surface and the plane of the first top surface, such that the shape of the first peripheral wiring is regular, which facilitates controlling the distance between the first and second peripheral wirings by controlling the distance between the third inclined surface of each second bent part and the second inclined surface of the corresponding first bent part of the first peripheral wiring as well as the distance between the fourth inclined surface of the second bent part and the first inclined surface of the corresponding first bent part of the first peripheral wiring, and facilitates manufacturing the peripheral wirings.

Specifically, the angle formed by the first inclined surface and the first top surface is 45° and the angle formed by the second inclined surface and the first top surface is 45°.

Alternatively, the angle formed by the first inclined surface and the first top surface is 60° and the angle formed by the second inclined surface and the first top surface is 60°.

In another embodiment, which is illustrated in the structure of FIGS. 2 and 3, in each peripheral wiring, and in each first opening part, a fifth inclined surface parallel to the third inclined surface is formed between a bottom surface and a lateral surface of the first opening part, and a sixth inclined surface parallel to the fourth inclined surface is formed between the bottom surface and another lateral surface of the first opening part. In the first opening part 224 of the second peripheral wiring 2 shown in FIG. 3, the first opening part 224 is provided with a fifth inclined surface 2241 parallel to the third inclined surface 2212, and a sixth inclined surface 2242 parallel to the fourth inclined surface 2214.

Optionally, in each peripheral wiring, and in each second opening part, a seventh inclined surface parallel to the first inclined surface is formed between a bottom surface and a lateral surface of the second opening part, and an eighth inclined surface parallel to the second inclined surface is formed between the bottom surface and another lateral surface of the second opening part. In the second opening part 116 of the first peripheral wiring 1 shown in FIG. 3, it is provided with a seventh inclined surface 1161 parallel to the first inclined surface 1152, and an eighth inclined surface 1162 parallel to the second inclined surface 1154.

In case that the peripheral wiring has the above-mentioned structure, each peripheral wiring has an uniform width and its original width is reserved, so the resistance difference between the distal and proximal ends of each peripheral wiring does not change in contrast to the wiring mode of right angle design. In comparison to the conventional wiring design, it does not increase split-screen or strip-shaped and wire-shaped Mura risk of the display.

The present disclosure also provides a display substrate comprises a substrate and the above-mentioned peripheral wiring structure formed thereon.

The present disclosure also provides a display panel comprises the display substrate mentioned above.

The present disclosure also provides a display device comprises the display panel mentioned above.

The above embodiments are only to illustrate rather than to limit the present disclosure, it would be appreciated by those skilled in the art that various changes or modifications may be made in these embodiments without departing from the principles and spirit of the disclosure, and thus all equivalent technical solutions shall fall within the scope of the present disclosure. The scope of the present disclosure should be defined in the claims and their equivalents.

What is claimed is:

1. A peripheral wiring structure, comprising a plurality of peripheral wirings formed on a substrate, each peripheral wiring having first opening parts and second opening parts which are arranged alternatively such that the peripheral wiring has a serpentine shape;
   wherein in each two adjacent peripheral wirings,
   a first opening part of a first peripheral wiring opens to a second peripheral wiring, the first opening part of the first peripheral wiring is in one-to-one correspondence with the first opening part of the second peripheral wiring, and centerlines of each pair of the first opening parts corresponding to each other are coincident;
   a second opening part of a second peripheral wiring opens to the first peripheral wiring, the second opening part of the second peripheral wiring is in one-to-one correspondence with the second opening part of the first peripheral wiring, and centerlines of each pair of the second opening parts corresponding to each other are coincident;
   and wherein in each two adjacent peripheral wirings,
   in the first peripheral wiring, a first bent part bulged toward the second peripheral wiring is formed between each two adjacent first opening parts, the first bent part having a first inclined surface connected to a lateral surface of one first opening part, a first top surface connected to the first inclined surface, and a second inclined surface connected to the first top surface and a lateral surface of another first opening part, wherein the first top surface is perpendicular to an arrangement direction of the plurality of peripheral wirings;
   in the second peripheral wiring, a second bent part bulged toward the first peripheral wiring is formed between each two adjacent second opening parts, the second bent part having a third inclined surface connected to a lateral surface of one second opening part, a second top surface connected to the third inclined surface, and a fourth inclined surface connected to the second top surface and a lateral surface of another second opening part, wherein the second top surface is perpendicular to an arrangement direction of the plurality of peripheral wirings;
   in a direction perpendicular to the arrangement direction of the plurality of peripheral wirings, a centerline of each second bent part is located between two adjacent first bent parts, and the third inclined surface of the second bent part is opposite to and parallel to the second inclined surface of one first bent part, and the distance between the third and second inclined surfaces is larger than that between the second and first top surfaces; the fourth inclined surface of the second bent part is opposite to and parallel to the first inclined surface of another first bent part, and the distance between the fourth and first inclined surfaces is larger than that between the second and first top surfaces.

2. The peripheral wiring structure according to claim 1, wherein in each first bent part, an angle formed by the first inclined surface and the first top surface is identical to that formed by the second inclined surface and the first top surface.

3. The peripheral wiring structure according to claim 2, wherein the angle formed by the first inclined surface and the first top surface is 45° and the angle formed by the second inclined surface and the first top surface is 45°.

4. The peripheral wiring structure according to claim 2, wherein the angle formed by the first inclined surface and the first top surface is 60° and the angle formed by the second inclined surface and the first top surface is 60°.

5. The peripheral wiring structure according to claim 1, wherein, in each peripheral wiring, and in each first opening part, a fifth inclined surface parallel to the third inclined surface is formed between a bottom surface and a lateral surface of the first opening part, and a sixth inclined surface parallel to the fourth inclined surface is formed between the bottom surface and another lateral surface of the first opening part.

6. The peripheral wiring structure according to claim 1, wherein, in each peripheral wiring, and in each second opening part, a seventh inclined surface parallel to the first inclined surface is formed between a bottom surface and a lateral surface of the second opening part, and a eighth inclined surface parallel to the second inclined surface is formed between the bottom surface and another lateral surface of the second opening part.

7. A display substrate comprising a substrate and the peripheral wiring structure formed on the substrate according to claim 1.

8. A display panel comprising the display substrate according to claim 7.

* * * * *